(12) United States Patent
Nakasugi et al.

(10) Patent No.: US 10,435,555 B2
(45) Date of Patent: Oct. 8, 2019

(54) VOID FORMING COMPOSITION, SEMICONDUCTOR DEVICE PROVIDED WITH VOIDS FORMED USING COMPOSITION, AND METHOD FOR MANUFACTURING SEMICONDUCTOR DEVICE USING COMPOSITION

(71) Applicant: AZ Electronic Materials (Luxembourg) S.a.r.l., Luxembourg (LU)

(72) Inventors: Shigemasa Nakasugi, Kakegawa (JP); Takafumi Kinuta, Kakegawa (JP); Go Noya, Kakegawa (JP)

(73) Assignee: AZ Electronic Materials (Luxembourg) S.a.r.l (LU)

(*) Notice: Subject to any disclaimer, the term of this patent is extended or adjusted under 35 U.S.C. 154(b) by 0 days.

(21) Appl. No.: 15/313,670

(22) PCT Filed: May 26, 2015

(86) PCT No.: PCT/JP2015/065030
§ 371 (c)(1),
(2) Date: Nov. 23, 2016

(87) PCT Pub. No.: WO2015/182581
PCT Pub. Date: Dec. 3, 2015

(65) Prior Publication Data
US 2017/0210896 A1    Jul. 27, 2017

(30) Foreign Application Priority Data

May 29, 2014  (JP) .................................. 2014-111552

(51) Int. Cl.
*C08L 65/02* (2006.01)
*C08G 61/12* (2006.01)
(Continued)

(52) U.S. Cl.
CPC .............. *C08L 65/02* (2013.01); *C08G 61/12* (2013.01); *C08L 65/00* (2013.01); *C08L 71/00* (2013.01);
(Continued)

(58) Field of Classification Search
CPC .... C08G 65/4012; C08G 65/40; C08G 75/23; C08G 73/026; C08L 79/02; C08L 85/02; C08L 85/04
See application file for complete search history.

(56) References Cited

U.S. PATENT DOCUMENTS 3,933,764 A * 1/1976 McMaster .............. C08G 75/20
528/391
5,043,112 A * 8/1991 Beck ................... B01D 53/228
210/500.23

(Continued)

FOREIGN PATENT DOCUMENTS

CN    1403491 A    3/2003
CN    1760235 A    4/2006

(Continued)

OTHER PUBLICATIONS

Johnson et al. (Journal of Polymer Science Part A-1 vol. 5, 2415-2427, (1967)) (Year: 1967).*

(Continued)

*Primary Examiner* — Liam J Heincer
(74) *Attorney, Agent, or Firm* — Drinker Biddle & Reath LLP

(57) ABSTRACT

To provide a composition for gap formation capable of forming sacrifice areas made of a sacrificial material decomposable completely into vapor at a desired temperature, and also to provide a semiconductor device-manufacturing method using the composition.

(Continued)

Disclosed is a composition for gap formation comprising a polymer and a solvent:
wherein said polymer comprising five or more of repeating units which are represented by at least one kind of the following formula (1) or (2):

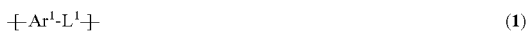

(1)

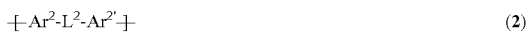

(2)

[each of $Ar^1$, $Ar^2$ and $Ar^{2'}$ is independently a substituted or unsubstituted aromatic group; and each of $L^1$ and $L^2$ is independently oxygen, sulfur, alkyl, sulfone, amide, ketone or a group represented by the following formula (3):

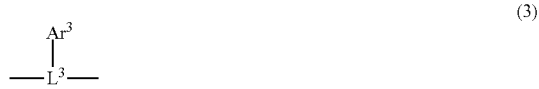

(3)

{$Ar^3$ is an aromatic group; and $L^3$ is a trivalent atom selected from the group consisting of nitrogen, boron and phosphorus}].

15 Claims, 1 Drawing Sheet

(51) Int. Cl.
| | | |
|---|---|---|
| C08L 65/00 | (2006.01) | |
| H01L 23/532 | (2006.01) | |
| H01L 21/768 | (2006.01) | |
| C08L 71/00 | (2006.01) | |
| C08L 71/12 | (2006.01) | |
| C08L 77/10 | (2006.01) | |
| C08L 79/02 | (2006.01) | |
| C08L 81/02 | (2006.01) | |
| C08L 81/06 | (2006.01) | |
| C08G 73/02 | (2006.01) | |
| C08L 85/02 | (2006.01) | |
| C08L 85/04 | (2006.01) | |

(52) U.S. Cl.
CPC .............. *C08L 71/12* (2013.01); *C08L 77/10* (2013.01); *C08L 79/02* (2013.01); *C08L 81/02* (2013.01); *C08L 81/06* (2013.01); *C08L 85/02* (2013.01); *C08L 85/04* (2013.01); *H01L 21/768* (2013.01); *H01L 21/76802* (2013.01); *H01L 21/76877* (2013.01); *H01L 23/532* (2013.01); *H01L 23/5329* (2013.01); *C08G 73/026* (2013.01); *C08G 2261/11* (2013.01); *C08G 2261/312* (2013.01); *C08G 2261/3162* (2013.01); *C08G 2650/40* (2013.01); *H01L 2924/0002* (2013.01)

(56) References Cited

U.S. PATENT DOCUMENTS

| | | | | |
|---|---|---|---|---|
| 5,461,003 | A | | 10/1995 | Havemann et al. |
| 6,165,890 | A | | 12/2000 | Kohl et al. |
| 7,176,053 | B1 | * | 2/2007 | Dimmler ............... B82Y 30/00 |
| | | | | 257/E21.033 |
| 2002/0081787 | A1 | * | 6/2002 | Kohl .................. H01L 21/7682 |
| | | | | 438/200 |
| 2002/0145201 | A1 | * | 10/2002 | Armbrust ........... H01L 21/7682 |
| | | | | 257/776 |
| 2003/0203592 | A1 | * | 10/2003 | Kloster ................ H01L 21/764 |
| | | | | 438/411 |
| 2005/0124172 | A1 | * | 6/2005 | Townsend, III .... H01L 21/0271 |
| | | | | 438/780 |
| 2007/0243664 | A1 | * | 10/2007 | Hirano ............... B23K 35/0244 |
| | | | | 438/108 |
| 2008/0153395 | A1 | * | 6/2008 | Kulp ..................... B24B 37/24 |
| | | | | 451/41 |
| 2008/0179753 | A1 | * | 7/2008 | Won .................... H01L 21/7682 |
| | | | | 257/773 |
| 2009/0085227 | A1 | * | 4/2009 | Shiraishi ............... H05K 3/303 |
| | | | | 257/778 |
| 2009/0247701 | A1 | * | 10/2009 | Inabe ..................... C08L 25/06 |
| | | | | 525/94 |
| 2010/0164126 | A1 | | 7/2010 | Takahashi et al. |
| 2010/0227170 | A1 | | 9/2010 | Endo et al. |
| 2011/0180884 | A1 | * | 7/2011 | Lazarus ................. H01L 28/40 |
| | | | | 257/414 |
| 2012/0108693 | A1 | * | 5/2012 | Gibon .................... C08G 69/40 |
| | | | | 521/180 |
| 2012/0130041 | A1 | * | 5/2012 | Han .................... C08G 65/4012 |
| | | | | 528/125 |
| 2012/0146234 | A1 | * | 6/2012 | Beaupre ................ H01L 21/56 |
| | | | | 257/774 |
| 2014/0154628 | A1 | | 6/2014 | Nagoshi et al. |
| 2016/0002431 | A1 | * | 1/2016 | Bajjuri .................... C08J 11/08 |
| | | | | 524/876 |
| 2016/0011510 | A1 | * | 1/2016 | Wang .................... C08F 20/10 |
| | | | | 430/325 |
| 2016/0152776 | A1 | * | 6/2016 | Weber .................... C08G 75/23 |
| | | | | 528/174 |
| 2016/0185984 | A1 | * | 6/2016 | Aqad .................... C09D 171/00 |
| | | | | 524/612 |
| 2016/0214068 | A1 | * | 7/2016 | Weber ................. B29C 47/0011 |
| 2016/0280536 | A1 | * | 9/2016 | Sugita ................ B81C 1/00047 |
| 2017/0218227 | A1 | * | 8/2017 | Nakasugi ............. C09D 175/06 |
| 2018/0039178 | A1 | * | 2/2018 | Suzuki ..................... G03F 7/11 |

FOREIGN PATENT DOCUMENTS

| | | |
|---|---|---|
| CN | 103396533 A | 11/2013 |
| JP | H0883839 A | 3/1996 |
| JP | H09172068 A | 6/1997 |
| JP | 2001085519 A | 3/2001 |
| JP | 2003342375 A | 12/2003 |
| JP | 2004063749 A | 2/2004 |
| JP | 2009265450 A | 11/2009 |
| JP | 2009275228 A | 11/2009 |
| WO | WO-2007010919 A1 | 1/2007 |
| WO | WO-2008126411 A1 | 10/2008 |
| WO | WO-2008146723 A1 | 12/2008 |
| WO | WO-2013022068 A1 | 2/2013 |

OTHER PUBLICATIONS

Liou et al. (Journal of Polymer Science: Part A: Polymer Chemistry, vol. 45, 3292-3302 (2007)) (Year: 2007).*
Chu et al. (Journal of Materials Science 24, 1989, 4538-4544) (Year: 1989).*
Beck (Journal of Applied Polymer Science, vol. 45, 1361-1366 (1992)) (Year: 1992).*
Picken et al. (Macromolecules 1990, 23, 3849-3854) (Year: 1990).*
Yao et al. (Fibers and Polymers, 2010, 11(7), 1032-1040) (Year: 2010).*
International Search Report for PCT/JP2015/065030 dated Sep. 1, 2015.
Chinese Office Action for Chinese Application No. 201580028112.0, dated Feb. 26, 2018.

* cited by examiner

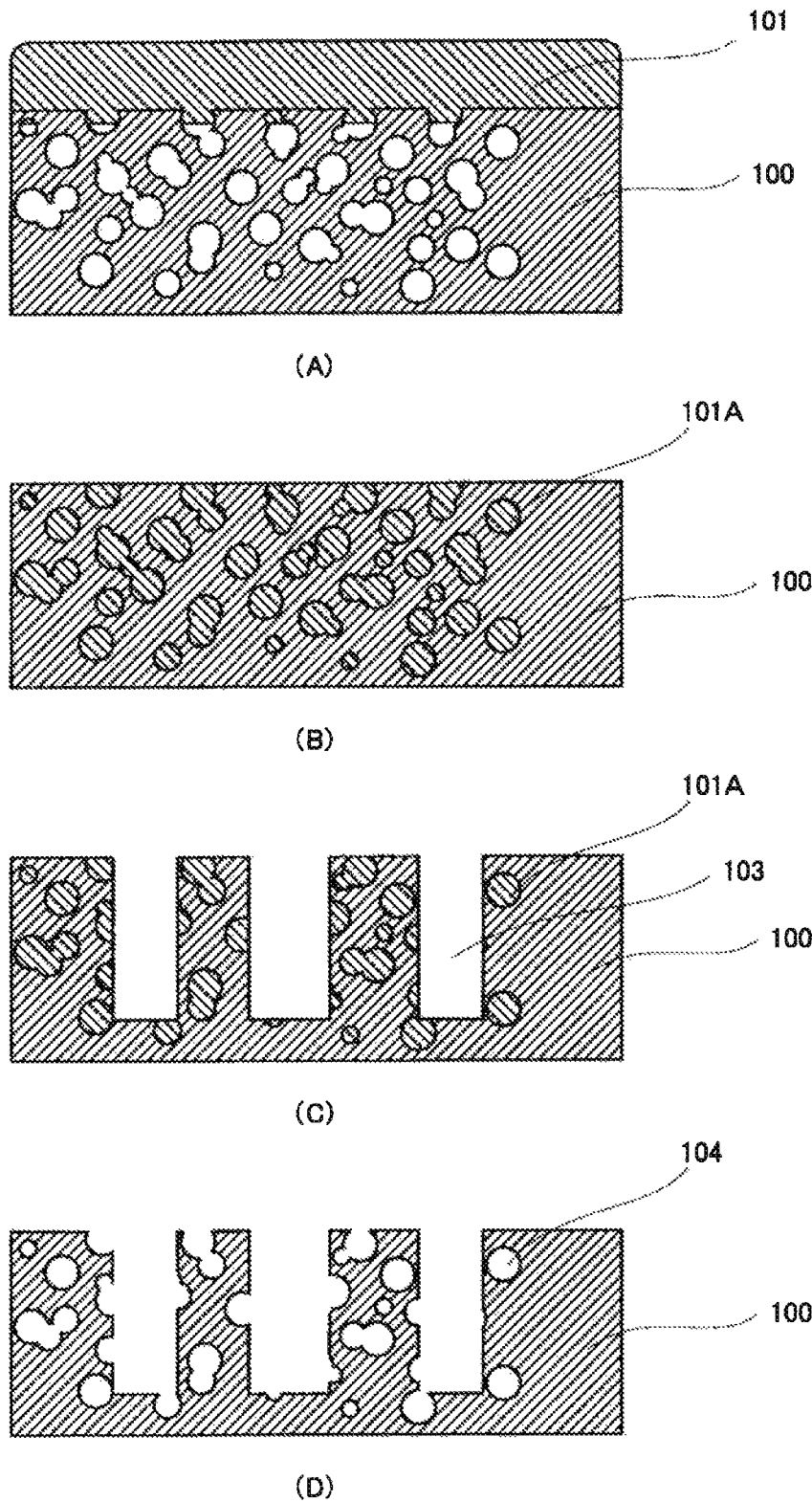

VOID FORMING COMPOSITION, SEMICONDUCTOR DEVICE PROVIDED WITH VOIDS FORMED USING COMPOSITION, AND METHOD FOR MANUFACTURING SEMICONDUCTOR DEVICE USING COMPOSITION

CROSS-REFERENCE TO RELATED APPLICATIONS

This application is a national stage application (under 35 U.S.C. § 371) of PCT/JP2015/065030, filed May 26, 2015, which claims benefit of Japanese Application No. 2014-111552, filed May 29, 2014, both of which are incorporated herein by reference in their entirety.

TECHNICAL FIELD

The present invention relates to a composition for gap formation capable of easily forming gaps among metal wirings in semiconductor elements and the like, and also relates to a method in which the composition is used to form gaps among the metal wirings.

BACKGROUND ART

Silica ($SiO_2$) films formed by vacuum processes such as CVD method have hitherto been often adopted as interlayer dielectrics in semiconductor elements and the like. Further, SOG (spin-on-glass) films, which are wet-coating type insulating films principally made of tetraalkoxysilane hydrolysate, are also employed mainly for the purpose of leveling. Recently, according as semiconductor elements and like have been getting more integrated, demands to interlayer dielectrics of low permittivity have increasingly grown in expectation of reducing stray capacity among the wirings and thereby of improving wire delay. As a means for reducing stray capacity among the wirings, semiconductor devices disclosed in Patent documents 1, 2 and 3 contain gaps formed among the wirings. Those documents disclose a method comprising the steps of: filling gaps among the wirings with a filler, such as, organic resist or silica compound; and then removing the filler by etching or ashing to form gaps among the wirings. However, that method needs complicated operations, and hence there is room for improvement. Further, although Patent documents 4, 5 and 6 disclose fillers for forming gaps among the wirings, those fillers are poor in thermal stability at about 400° C. and hence cannot fully reduce stray capacity among the wirings. Accordingly, there is also room for improvement.

PRIOR ART DOCUMENTS

Patent Documents

[Patent document 1] Japanese Patent Laid-Open No. H9(1997)-172068
[Patent document 2] Japanese Patent Laid-Open No. H8(1996)-83839
[Patent document 3] Japanese Patent Laid-Open No. 2001-85519
[Patent document 4] Japanese Patent Laid-Open No. 2003-342375
[Patent document 5] Japanese Patent Laid-Open No. 2004-63749
[Patent document 6] Japanese Patent Laid-Open No. 2009-275228

DISCLOSURE OF INVENTION

Problem to be Solved by the Invention

The present invention is achieved in consideration of the above background, and provides a composition for gap formation having a particular heatproof temperature and a particular decomposition temperature. Further, the present invention also provides a semiconductor device-manufacturing method using the composition.

Means for Solving Problem

The composition for gap formation according to the present invention comprises a polymer and a solvent: wherein said polymer comprising five or more of repeating units which are represented by at least one kind of the following formula (1) or (2):

     (1)

     (2)

in which
each of $Ar^1$, $Ar^2$ and $Ar^{2'}$ is independently an aromatic group having one or more benzene rings provided that said aromatic group may be substituted with a substituent selected from the group consisting of alkyl, aryl, alkoxy, nitro, amide, dialkylamino, sulfonamide, imide, carboxyl, sulfonic ester, alkylamino and arylamino; and
each of $L^1$ and $L^2$ is independently oxygen, sulfur, alkylene, sulfone, imide, carbonyl or a group represented by the following formula (3):

     (3)

in which
$Ar^3$ is an aromatic group having one or more benzene rings provided that said aromatic group may be substituted with a substituent selected from the group consisting of alkyl, aryl, alkoxy, nitro, amide, dialkylamino, sulfonamide, imide, carboxyl, sulfonic ester, alkylamino and arylamino; and
$L^3$ is a trivalent atom selected from the group consisting of nitrogen, boron and phosphorus.

Further, the method according to the present invention for forming gaps among wirings, comprises:
casting the above composition for gap formation to coat the surface of a porous dielectrics formed on a semiconductor substrate;
impregnating said composition for gap formation on the semiconductor substrate; and
removing said composition for gap formation to form gaps among the metal wirings.

Effect of the Invention

According to the present invention, the composition for gap formation containing a polymer having a particular heatproof temperature and a particular decomposition temperature is applied to a porous material, and thereby it becomes possible to easily form gaps among multilayer wirings and accordingly to readily manufacture semiconductor devices having desired properties.

BRIEF DESCRIPTION OF THE DRAWINGS

FIG. 1(A) to (D) are schematic sectional views illustrating a part of the semiconductor device-manufacturing method according to an embodiment of the present invention.

DETAILED DESCRIPTION

The following is a detailed description of embodiments according to the present invention.
[Composition for Gap Formation]

The present invention relates to a composition for gap formation. Here, the "composition for gap formation" means a composition for forming gaps among metal wirings and the like on the substrate, for example, in a process for manufacturing semiconductor devices. Specifically, the composition has the properties of being capable of filling gaps or pores on the substrate surface, of being thereafter stable below a particular temperature, and of being easily removable by vaporization above a particular temperature.

The composition for gap formation comprises a particular polymer and a solvent. The polymer comprises at least one kind of the repeating units represented by the following formula (1) or (2):

(1)

(2)

in which
each of $Ar^1$, $Ar^2$ and $Ar^{2'}$ is independently an aromatic group having one or more benzene rings provided that the aromatic group may be substituted with a substituent selected from the group consisting of alkyl, aryl, alkoxy, nitro, amide, dialkylamino, sulfonamide, carboxyl, sulfonic ester, alkylamino and arylamino; and
each of $L^1$ and $L^2$ is independently oxygen, sulfur, alkylene, sulfone, imide, carbonyl or a group represented by the following formula (3):

(3)

in which
$Ar^3$ is an aromatic group having one or more benzene rings provided that the aromatic group may be substituted with a substituent selected from the group consisting of alkyl, aryl, alkoxy, nitro, amide, dialkylamino, sulfonamide, imide, carboxyl, sulfonic ester, alkylamino and arylamino; and
$L^3$ is a trivalent atom selected from the group consisting of nitrogen, boron and phosphorus. The polymer contains five or more repeating units represented by the above formulas.

If comprising two or more kinds of the repeating units, the polymer may be either a random copolymer containing the repeating units at random or a block copolymer containing blocks of the repeating units. Further, the polymer may comprise repeating units other than the above as long as they do not impair the effect of the present invention.

In the formulas (1) and (2), each of $Ar^1$, $Ar^2$ and $Ar^{2'}$ is independently an aromatic group having one or more benzene rings. The aromatic group preferably has only one benzene ring, but may have a condensed ring such as naphthalene ring or anthracene ring. Each of $Ar^1$, $Ar^2$ and $Ar^{2'}$ is a divalent group, but there are no particular restrictions on the positions of the connecting bonds. This means that they may be positioned at any of o-, m- and p-positions. However, in view of the easiness of synthesis and of the heat-resistance, the connecting bonds are preferably both sited at p-position. Further, each of $Ar^1$, $Ar^2$ and $Ar^{2'}$ may be substituted with a substituent, which is selected from the group consisting of alkyl, aryl, alkoxy, nitro, amide, dialkylamino, sulfonamide, carboxyl, sulfonic ester, alkylamino and arylamino. However, if being too bulky, the substituent may deteriorate properties of the main polymer chain. Accordingly, the substituent preferably contains 10 or less carbon atoms.

Each of $L^1$ and $L^2$ is independently a linking group connecting to the aromatic group. This linking group is selected from oxygen, sulfur, alkylene, sulfone, imide or carbonyl. If being an alkylene group, the linking group is preferably such a relatively short one as has 1 to 3 carbon atoms. Further, it may otherwise be a group represented by the formula (3), in which $Ar^3$ is selected from aromatic groups having the same structures as $Ar^1$ and the like (but $Ar^3$ is a monovalent group). If $Ar^3$ further comprises an aromatic group as a substituent, the polymer consequently has what is called a branched chain structure. In the present invention, the polymer may have a branched chain structure as long as it does not impair the effect of the invention. However, if the polymer is highly branched, the heat-resistant is liable to be lowered. Accordingly, the polymer used in the present invention preferably has a straight chain structure.

Further, $L_3$ is selected from nitrogen, boron or phosphorus without particular limitations. However, in view of the availability and the easiness of synthesis of the polymer, nitrogen or boron is preferred.

Conventional compositions for gap formation generally comprise aromatic ring-containing polymers, in most of which the aromatic rings are positioned in the branched chains, typically like those in polystyrene. In contrast, however, the present inventors have found that the polymer in which aromatic rings are included in the main chain and bound to each other through the linking group of the above $L^1$ or $L^2$ has such high heat-resistance as to show excellent performance when used in a composition for gap formation.

The polymer used in the present invention can be controlled to have any molecular weight according the purpose. However, the weight average molecular weight is preferably 1000 to 1000000, more preferably 3000 to 500000. Here, the "weight average molecular weight" means polystyrene conversion weight average molecular weight in the present invention. In view of the impregnability and the evenness of the formed film when applying the composition, the polymer preferably has a narrow distribution of molecular weight.

The composition for gap formation according to the present invention also contains a solvent, which needs to be capable of dissolving the above polymer.

Examples of the solvent include: water, ethanol, isopropanol (IPA), ethyl lactate (EL), propyleneglycol monomethyl ether acetate (PGMEA), propyleneglycol monomethyl ether (PGME), acetone, methyl isobutyl ketone (MIBK), methyl isobutyl carbinol (MIBC), methyl amyl ketone (MAK), tetrahydrofuran (THF), γ-butyrolactone (GBL), N-methylpyrrolidone (NMP), dimethylacetamide (DMAC), cyclohexanone, chlorobenzene, chloroform, acetonitrile, and toluene. Among them, solvents preferred in view of the dissolving ability are THF, GBL, NMP, DMAC, cyclohexanone, chlorobenzene and toluene. On the other hand, in view of the coatability, THF, GBL, cyclohexanone, chlorobenzene and toluene are preferred. Further, if necessary, those may be used in combination of two or more. For example, mixed solvents of THF, GBL, NMP, DMAC, cyclohexanone and chlorobenzene are preferred in view of the temporal stability.

The composition for gap formation of the present invention necessarily contains the aforementioned polymer and solvent. The content of the polymer in the composition is appropriately controlled according to the sizes of the aimed gaps and the viscosity of the composition, but is generally 0.2 to 20 wt %, preferably 0.3 to 10 wt %, more preferably 0.5 to 5 wt %, based on the total weight of the composition.

If necessary, the composition for gap formation of the present invention can further contain other components, such as, surfactant, smoothing agent, and germicide. Among them, the composition preferably contains a surfactant in view of the coatability. As the surfactant, any known one can be used but an alkylene glycol chain-containing one is particularly preferred. Those additives essentially give no effect to the performance of the fine pattern-forming composition and are contained in an amount of generally 1% or less, preferably 0.1% or less, more preferably 0.05% or less, based on the total weight of the composition.

In the present invention, the composition for gap formation needs to fill into narrow trenches and small pores. Accordingly, the viscosity thereof is often an important factor of the invention and hence is appropriately controlled according to the purpose. However, in order to make the composition impregnate into the pores, the composition applied on the substrate can be placed under such a high temperature environment that the viscosity is reduced enough for the composition to impregnate into the pores. In this way, even if having a relatively high viscosity at room temperature, the composition can be made to sufficiently fill into the pores.

[Methods for Forming Gaps Among Wirings and for Manufacturing Semiconductor Devices]

In the methods of the present invention for forming gaps among wirings and for manufacturing semiconductor devices, materials beforehand provided with gaps, pores, trenches or grooves, and other concave areas are protected in the process for forming semiconductor devices. Those materials are generally referred to as "porous materials" in the present invention. The present invention is applied to materials of low permittivity, and most of them are porous materials containing plural pores. Specifically, those porous materials have low densities and accordingly tend to suffer from physical or chemical damages when, for example, subjected to dry-etching. Further, the materials containing pores have surfaces on which concavities and the like attributed to the pores are dispersed. On those surfaces, the marginal areas tend to suffer from physical or chemical damages as compared with the flat areas. The second method of the present invention prevents those damages. The method will be explained below with reference to the accompanying drawings.

First, a composition for gap formation 101 is applied on the surface of a porous material 100 (FIG. 1(A)). Examples of the porous material include silicon dioxide and polyamide. The size and porosity of pores or gaps formed in the porous material depend on the performances of the aimed semiconductor devices, but the average pore diameter is generally 100 nm or less, preferably 40 nm or less. The porosity is generally 5 to 70%, preferably 5 to 50%. Here, the average pore diameter can be measured by observation with a transmission electron microscope (TEM), and the porosity can be obtained by calculation from the permittivity according to the logarithmic mixture rule.

The composition for gap formation 101 applied on the surface of the porous material 100 gradually impregnates thereinto to fill the pores with the passage of time. However, the impregnation can be accelerated by heating or pressing, preferably by heating. According as heated to raise the temperature, the composition becomes less viscous and hence is promoted to impregnate into the pores. In consideration of the coatability and the impregnability, the solvent used in the composition is preferably selected.

After the composition for gap formation 101 is sufficiently filled into the porous material 100, a part or all of the solvent in the composition is vaporized by heating or the like so as to solidify and thereby convert the composition in the pores into a sacrificial material 101A. Thereafter, the sacrificial material appearing on the surface is then removed, if necessary, to obtain a porous material in which the pores are filled with the sacrificial material (FIG. 1(B)). Those filled pores fill the role of sacrifice areas.

Successively, the porous material is subjected to surface-processing of plasma etching or dry etching to form concave areas such as grooves 103 (FIG. 1(C)). The plasma etching or dry etching in this step is carried out under the conditions different from those of plasma treatment carried out later for removing the sacrificial material. Specifically, if the porous material is made of silicon dioxide, it is general to use $CF_4$, $CHF_3$ or a mixed gas thereof in dry etching. In this procedure, since the pores are filled with the sacrificial material in the present invention, the whole material has such high mechanical strength as to suffer less damage from lithographic treatment, plasma etching or dry etching.

After the plasma or etching treatment, the grooves 103 are filled with a metal material by, for example, chemical vapor deposition to form metal wirings. Subsequently, the sacrificial material is then selectively removed. There are no particular restrictions on the process for selectively removing the sacrificial material. For example, this procedure is preferably carried out in a manner where the material is decomposed by heating and thereby removed, where the material is removed by plasma treatment, where the material is removed by dissolving in a solvent, or where the material is removed by exposing to high-energy radiation. It is particularly preferred to remove the sacrificial material by heating. For example, the whole porous material is heated so that the sacrificial material 101A filling the pores can be decomposed, vaporized and thereby removed (FIG. 1(D)). As a result, the sacrifice areas are converted back into hollow gaps 104. In this way, it is possible to obtain a surface-treated porous material without suffering damage from plasma etching or dry etching. Semiconductor devices manufactured by use of those undamaged porous materials have small amounts of defects, and hence can be produced in high productivity.

In the semiconductor device-manufacturing method, the composition for gap formation is preferably excellent in the coatability and in the impregnability into the porous material. In view of that, it is preferred to adopt a nonpolar solvent, such as MIBK, as the solvent. Also, for the purpose of keeping favorable impregnability of the composition, it is possible to control the molecular weight of the polymer in the composition. Specifically, the polymer has a weight average molecular weight of generally 1000 to 150000, preferably 1500 to 50000. Further, it is preferred that the polymer not be decomposed and vaporized during plasma etching or dry etching but be completely decomposed and vaporized when heated thereafter. The conditions of the plasma etching or dry etching and the temperature of heating are variously controlled according to various reasons, and hence at what temperature the sacrificial material is decomposed and vaporized is also variously controlled according to them. However, it is generally preferred that the sacrificial material not be substantially decomposed and vaporized, for example, at 400° C. but be substantially completely decomposed and vaporized, for example, at 600° C. Specifically, the sacrificial material reduces the weight by preferably 5% or less, further preferably 3% or less when heated at 400° C. for 1 hour, but by preferably 80% or more, further preferably 90% or more when heated at 600° C. for 1 hour. The solid content in the composition for gap formation of the present invention mostly consists of the above polymer, and hence the sacrificial material provided by the composition is virtually composed of the above polymer. Accordingly, the weight loss of the sacrificial material essentially corresponds to that of the polymer.

The present invention will be further explained in detail by Examples described below, but is by no means limited to them. Unless specifically stated otherwise in the following description, the "part(s)" means "weight part(s)". Further, tests and evaluations were carried out in the following manners.

[Molecular Weight]

The number average molecular weight (Mn), weight average molecular weight (Mw) and molecular-weight distribution (Mw/Mn) of the polymer were measured by gel permeation chromatography (GPC) in terms of polystyrene converted value.

[Weight Loss]

The weight loss of each sample was measured by thermogravimetry (TG) under the condition where the sample was heated to 400° C. or 600° C. at a rate of 20° C./minute and held at the temperature for 1 hour in an atmosphere of nitrogen gas or air.

[Verification of Impregnation of the Polymer Composition into Porous $SiO_2$ and of Gap Formation]

It was verified whether the polymer was impregnated or not and whether gaps were formed or not by observing changes of the refractive index at 633 nm with a spectroscopic ellipsometer.

POLYMER SYNTHESIS EXAMPLE 1

(Synthesis of poly-4-methyltriphenyleneamine (Polymer P1))

Iron(III) chloride (anhydrous) (519 parts) and chloroform (4330 parts) were mixed under a nitrogen atmosphere in a reaction vessel equipped with a stirrer, a condenser, a heater, a nitrogen-introduction tube and a thermostat, and the reaction temperature was kept at 50° C. Subsequently, 4-methyltriphenylamine (212 parts) dissolved in chloroform (440 parts) was added and stirred. The reaction temperature was kept at 50° C. for 0.5 hour so that the reaction might proceed.

After the reaction was completed, the reaction solution was poured into acetone (54000 parts) and then precipitate was collected by filtration. The precipitate was dissolved in chloroform (4000 parts), and insoluble residue was removed by filtration. To the filtrate, 1 wt % aqueous ammonia solution (4000 parts) was added. Successively, the chloroform solution was extracted, condensed and poured into acetone (54000 parts) and then precipitate was collected by filtration. The collected precipitate was dried in vacuum at 90° C., to obtain Polymer P1 in an amount of 85 parts (yield: 40%). The molecular weight thereof was then measured by GPC to obtain the following results: number average molecular weight Mn =2170 Da, weight average molecular weight Mw=3991 Da, and molecular-weight distribution Mw/Mn=1.84.

POLYMER SYNTHESIS EXAMPLE 2

(Synthesis of poly-4-methyltriphenyleneamine (Polymer P2))

The procedure of Polymer synthesis example 1 was repeated except for changing the reaction time from 0.5 hour to 1 hour, to obtain Polymer P2 in an amount of 87 parts (yield: 41%). The molecular weight thereof was then measured by GPC to obtain the following results: number average molecular weight Mn=3157 Da, weight average molecular weight Mw=6030 Da, and molecular-weight distribution Mw/Mn=1.91.

EXAMPLE 1

Cyclohexanone (275 parts) was added to Polymer P1 (10 parts), and the mixture was stirred for 30 minutes at room temperature to prepare a composition for gap formation.

The prepared composition for gap formation was spin-coated on a porous $SiO_2$ wafer, and heated at 150° C. for 5 minutes on a vacuum hot plate in a nitrogen atmosphere, to obtain a gap-forming polymer film. The weight loss of the gap-forming polymer film was independently measured in the manner described above, and as a result it was found that the film lost the weight by 0.03% and 99.23% when heated (in an atmosphere of air) for 1 hour at 400° C. and 600° C., respectively.

The gap-forming polymer film formed on the wafer was then heated at 330° C. for 5 minutes on a vacuum hot plate in a nitrogen atmosphere, and was thereby impregnated into the porous $SiO_2$ wafer. Thereafter, the wafer was rinsed for 20 seconds with cyclohexanone, which was used as the solvent of the composition, to remove excess of the gap-forming polymer film on the porous $SiO_2$ wafer. The obtained $SiO_2$ wafer impregnated with the polymer film was measured with a spectroscopic ellipsometer to find that the refractive index (n value) at 633 nm was 1.46. After heated at 400° C. for 1 hour in an atmosphere of air, the wafer was again measured to find that the refractive index (n value) at 633 nm was 1.46. The wafer was then heated at 600° C. for 1 hour in an atmosphere of air to thermally decompose the gap-forming polymer film, and subsequently was further measured to find that the refractive index (n value) at 633 nm was 1.31, which was similar to the refractive index (n value) of an untreated porous $SiO_2$ wafer.

EXAMPLES 2 TO 7 AND COMPARATIVE EXAMPLES 1 AND 2

The procedure of Example 1 was repeated except for changing the components of the composition for gap formation into those shown in Table 1, to prepare and evaluate compositions of Examples 2 to 7 and Comparative examples 1 and 2. The results are shown in Table 1.

TABLE 1

| | Composition | | | | | | Refractive index (n) | | | | | | Weight reduction | | | |
|---|---|---|---|---|---|---|---|---|---|---|---|---|---|---|---|---|
| | | | | | | | 25° C. | 330° C. | 400° C. | | 600° C. | | 400° C. | | 600° C. | |
| | | | | | Polymer | | | | | | | | | | | |
| | Polymer | Mn | Mw | Mw/Mn | content % | Solvent | $N_2$ | $N_2$ | $N_2$ | Air | $N_2$ | Air | $N_2$ | Air | $N_2$ | Air |
| Porous SiO₂ | — | — | — | — | — | — | 1.31 | — | — | — | — | — | — | — | — | — |
| Ex. 1 | P1 | 2170 | 3991 | 1.84 | 3.5 | cyclohexanone | — | 1.46 | — | 1.46 | — | 1.31 | — | 0.03 | — | 99.2 |
| Ex. 2 | P1 | 2170 | 3991 | 1.84 | 3.5 | cyclohexanone | — | 1.47 | 1.46 | — | — | 1.32 | 0.01 | — | — | 98.4 |
| Ex. 3 | P2 | 3157 | 6030 | 1.91 | 2.8 | chlorobenzene | — | 1.44 | — | 1.45 | — | 1.33 | — | 0.01 | — | 99.7 |
| Ex. 4 | P3 | 8521 | 17979 | 2.11 | 2.5 | cyclohexanone | — | 1.45 | — | 1.44 | — | 1.34 | — | 0.12 | — | 99.2 |
| Ex. 5 | P4 | 21050 | 30050 | 1.43 | 1.9 | toluene | — | 1.44 | — | 1.43 | — | 1.32 | — | 0.44 | — | 99.4 |
| Ex. 6 | P5 | 21040 | 35005 | 1.66 | 2.0 | chlorobenzene | — | 1.47 | — | 1.45 | — | 1.35 | — | 0.14 | — | 99.2 |
| Ex. 7 | P6 | 2540 | 4021 | 1.58 | 3.3 | chlorobenzene | — | 1.46 | — | 1.49 | — | 1.30 | — | 0.61 | — | 97.6 |
| Com. 1 | P7 | 137600 | 144480 | 1.05 | 2.4 | PGMEA | — | 1.46 | 1.39 | — | 1.32 | — | 4.34 | — | 100 | — |
| Com. 2 | P7 | 137600 | 144480 | 1.05 | 2.4 | PGMEA | — | 1.45 | — | 1.33 | — | 1.31 | — | 15.6 | — | 100 |

[Formulas 7]

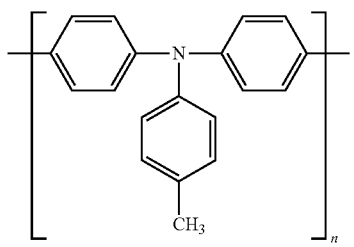

P1: Mw = 3,991
P2: Mw = 6,030

P3

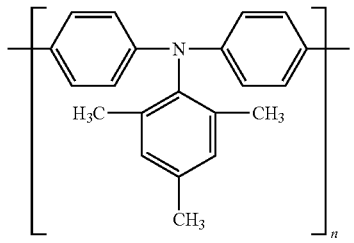

P4

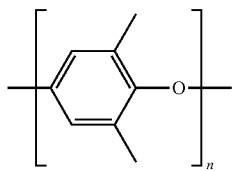

P5

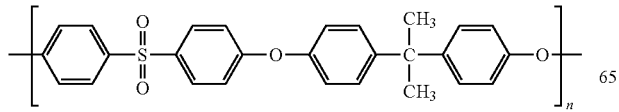

P6

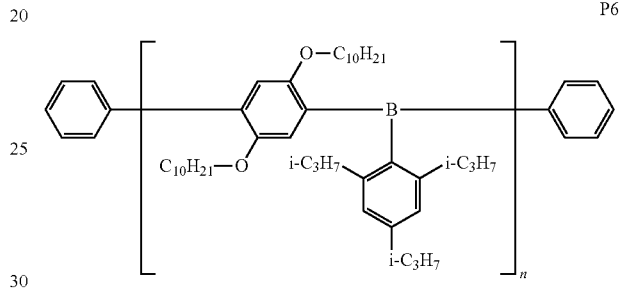

P7

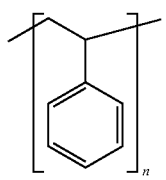

DESCRIPTION OF THE NUMERALS

100: porous material,
101: composition for gap formation,
101A: sacrifice area,
103: groove,
104: gap

The invention claimed is:

1. A composition for gap formation comprising a polymer and a solvent:
   wherein said polymer comprising five or more of repeating units which are represented by at least one kind of the following formula (1) or (2):

 (1)

 (2)

in which
each of $Ar^1$, $Ar^2$ and $Ar^{2'}$ is independently an aromatic group having one or more benzene rings provided that said aromatic group may be substituted with a substituent selected from the group consisting of alkyl, aryl, alkoxy, nitro, amide, dialkylamino, sulfonamide, imide, carboxyl, sulfonic ester, alkylamino and arylamino; and
each of $L^1$ and $L^2$ is independently oxygen, sulfur, alkylene, amide, carbonyl or a group represented by the following formula (3):

 (3)

in which

Ar$^3$ is an aromatic group having one or more benzene rings provided that said aromatic group may be substituted with a substituent selected from the group consisting of alkyl, aryl, alkoxy, nitro, amide, dialkylamino, sulfonamide, imide, carboxyl, sulfonic ester, alkylamino and arylamino; and L$^3$ is a trivalent atom selected from the group consisting of nitrogen, boron and phosphorus and wherein at least one of L$^1$ and L$^2$ is oxygen, alkylene, amide, carbonyl or sulfur and at least one L$^1$ and L$^2$ is the group of the formula (3) and wherein the content of said polymer is in the range of 0.2 to 10 wt % based on the total weight of the composition.

2. The composition for gap formation according to claim 1, wherein each of said Ar$^1$, Ar$^2$ and Ar$^{2'}$ is an aromatic group having one benzene ring.

3. The composition for gap formation according to claim 1, wherein said polymer has a weight average molecular weight of 1,000 to 1,000,000.

4. The composition for gap formation according to claim 1, which reduces the weight by 5% or less when heated at 400° C. for 1 hour and reduces the weight by 80% or more when heated at 600° C. for 1 hour, in an atmosphere of an inert gas or air.

5. The composition for gap formation according to claim 1, wherein each of L$^1$ and L$^2$ is independently oxygen, alkylene, amide, carbonyl or a group represented by the formula (3).

6. The composition for gap formation according to claim 1, wherein at least one of L$^1$ and L$^2$ is oxygen.

7. The composition for gap formation according to claim 1, wherein at least one of L$^1$ and L$^2$ is alkylene.

8. The composition for gap fonnation according to claim 1, wherein at least one of L$^1$ and L$^2$ is carbonyl.

9. The composition for gap formation according to claim 1, wherein the content of said polymer is in the range of 0.5 to 5 wt % based on the total weight of the composition.

10. The composition for gap formation according to claim 1, wherein at least one of L$^1$ and L$^2$ is oxygen, alkylene or carbonyl.

11. The composition for gap formation according to claim 1, wherein each of L$^1$ and L$^2$ is independently oxygen, alkylene, carbonyl or a group represented by the formula (3).

12. A method for manufacturing a semiconductor device provided with a porous material containing plural pores, which comprises:

applying the composition for gap formation according to claim 1 to coat said porous material so that said plural pores may be filled with said composition, vaporizing a part or all of the solvent in said composition to form sacrifice areas made of a sacrificial material, forming concave areas on the surface of said porous material, filling said concave areas with a metal material so as to form metal wirings, and removing said sacrificial material selectively so as to convert said sacrifice areas back into hollow gaps.

13. The method according to claim 12, wherein said porous material has a porosity of 5 to 70%.

14. The method according to claim 12, wherein the step of removing said sacrificial material is carried out in a manner where the material is decomposed by heating and thereby removed, where the material is removed by plasma treatment, where the material is removed by dissolving in a solvent, or where the material is removed by exposing to high-energy radiation.

15. A semiconductor device manufactured by the method according to claim 12.

* * * * *